(12) United States Patent
Chen et al.

(10) Patent No.: US 9,484,451 B2
(45) Date of Patent: Nov. 1, 2016

(54) MOSFET ACTIVE AREA AND EDGE TERMINATION AREA CHARGE BALANCE

(75) Inventors: Qufei Chen, San Jose, CA (US); Kyle Terrill, Santa Clara, CA (US); Sharon Shi, San Jose, CA (US)

(73) Assignee: VISHAY-SILICONIX, Santa Clara, CA (US)

( * ) Notice: Subject to any disclaimer, the term of this patent is extended or adjusted under 35 U.S.C. 154(b) by 1196 days.

(21) Appl. No.: 12/203,846

(22) Filed: Sep. 3, 2008

(65) Prior Publication Data

US 2009/0090967 A1 Apr. 9, 2009

Related U.S. Application Data

(60) Provisional application No. 60/997,945, filed on Oct. 5, 2007.

(51) Int. Cl.
| | |
|---|---|
| H01L 21/8238 | (2006.01) |
| H01L 29/78 | (2006.01) |
| H01L 29/66 | (2006.01) |
| H01L 29/08 | (2006.01) |
| H01L 29/06 | (2006.01) |
| H01L 29/10 | (2006.01) |
| H01L 29/40 | (2006.01) |

(52) U.S. Cl.
CPC ........ *H01L 29/7813* (2013.01); *H01L 29/0634* (2013.01); *H01L 29/0878* (2013.01); *H01L 29/66734* (2013.01); *H01L 29/7811* (2013.01); *H01L 29/1095* (2013.01); *H01L 29/407* (2013.01)
USPC .......................................................... 438/217

(58) Field of Classification Search
CPC .................................................. H01L 29/7811

USPC ................................................. 438/217, 270
See application file for complete search history.

(56) References Cited

U.S. PATENT DOCUMENTS

| | | | |
|---|---|---|---|
| 4,191,603 A | 3/1980 | Garbarino et al. | |
| 4,375,999 A | 3/1983 | Nawata et al. | |

(Continued)

FOREIGN PATENT DOCUMENTS

| | | |
|---|---|---|
| DE | 3932621 | 4/1990 |
| DE | 10343084 A1 | 5/2005 |

(Continued)

OTHER PUBLICATIONS

Takemura et al., "BSA Technology for Sub-100nm Deep Base Bipolar Transistors", Int'l Elec. Devs. Meeting, 1987, pp. 375-378. Jan.

(Continued)

*Primary Examiner* — Zandra Smith
*Assistant Examiner* — Andre' C Stevenson (57) ABSTRACT

A method for fabricating a MOSFET having an active area and an edge termination area is disclosed. The method includes forming a first plurality of implants at the bottom of trenches located in the active area and in the edge termination area. A second plurality of implants is formed at the bottom of the trenches located in the active area. The second plurality of implants formed at the bottom of the trenches located in the active area causes the implants formed at the bottom of the trenches located in the active area to reach a predetermined concentration. In so doing, the breakdown voltage of both the active and edge termination areas can be made similar and thereby optimized while maintaining advantageous RDson.

15 Claims, 10 Drawing Sheets

(56) References Cited

U.S. PATENT DOCUMENTS

| | | |
|---|---|---|
| 4,399,449 A | 8/1983 | Herman et al. |
| 4,532,534 A | 7/1985 | Ford et al. |
| 4,584,025 A | 4/1986 | Takaoka et al. |
| 4,593,302 A | 6/1986 | Lidow et al. |
| 4,602,266 A | 7/1986 | Coe |
| 4,620,211 A | 10/1986 | Baliga et al. |
| 4,646,117 A | 2/1987 | Temple |
| 4,680,853 A | 7/1987 | Lidow et al. |
| 4,710,265 A | 12/1987 | Hotta |
| 4,803,532 A | 2/1989 | Mihara |
| 4,819,044 A | 4/1989 | Murakami |
| 4,819,052 A | 4/1989 | Hutter |
| 4,941,026 A | 7/1990 | Temple |
| 4,954,854 A | 9/1990 | Dhong et al. |
| 4,974,059 A | 11/1990 | Kinzer |
| 4,982,249 A | 1/1991 | Kim et al. |
| 5,016,066 A | 5/1991 | Takahashi |
| 5,019,526 A | 5/1991 | Yamane et al. |
| 5,034,338 A | 7/1991 | Neppl et al. |
| 5,034,346 A | 7/1991 | Alter et al. |
| 5,072,266 A | 12/1991 | Bulucea et al. |
| 5,086,007 A | 2/1992 | Ueno |
| 5,087,577 A | 2/1992 | Strack |
| 5,156,993 A | 10/1992 | Su |
| 5,160,491 A | 11/1992 | Mori |
| 5,168,331 A | 12/1992 | Yilmaz |
| 5,171,699 A | 12/1992 | Hutter et al. |
| 5,233,215 A | 8/1993 | Baliga |
| 5,250,449 A | 10/1993 | Kuroyanagi et al. |
| 5,268,586 A | 12/1993 | Mukherjee et al. |
| 5,298,442 A | 3/1994 | Bulucea et al. |
| 5,316,959 A | 5/1994 | Kwan et al. |
| 5,341,011 A | 8/1994 | Hshieh et al. |
| 5,362,665 A | 11/1994 | Lu |
| 5,378,655 A | 1/1995 | Hutchings et al. |
| 5,396,085 A | 3/1995 | Baliga |
| 5,404,040 A | 4/1995 | Hshieh et al. |
| 5,422,508 A | 6/1995 | Yilmaz et al. |
| 5,429,964 A | 7/1995 | Yilmaz et al. |
| 5,497,013 A | 3/1996 | Temple |
| 5,521,409 A | 5/1996 | Hshieh et al. |
| 5,578,508 A | 11/1996 | Baba et al. |
| 5,597,765 A | 1/1997 | Yilmaz et al. |
| 5,614,751 A | 3/1997 | Yilmaz et al. |
| 6,096,584 A | 8/2000 | Ellis-Monaghan et al. |
| 6,228,700 B1 | 5/2001 | Lee |
| 6,238,981 B1 | 5/2001 | Grebs |
| 6,274,904 B1 | 8/2001 | Tihanyi |
| 6,465,843 B1 | 10/2002 | Hirler et al. |
| 6,489,204 B1 | 12/2002 | Tsui |
| 6,498,071 B2 | 12/2002 | Hijzen et al. |
| 6,620,691 B2 | 9/2003 | Hshieh et al. |
| 6,770,539 B2 | 8/2004 | Sumida |
| 6,794,239 B2 * | 9/2004 | Gonzalez .................... 438/217 |
| 6,825,105 B2 | 11/2004 | Grover et al. |
| 6,831,345 B2 | 12/2004 | Kinoshita et al. |
| 6,927,451 B1 | 8/2005 | Darwish |
| 6,987,305 B2 | 1/2006 | He et al. |
| 7,045,857 B2 | 5/2006 | Darwish et al. |
| 7,122,875 B2 | 10/2006 | Hatade |
| 7,224,022 B2 | 5/2007 | Tokano et al. |
| 7,319,256 B1 | 1/2008 | Kraft et al. |
| 7,335,946 B1 * | 2/2008 | Bhalla et al. ................. 257/334 |
| 7,348,235 B2 * | 3/2008 | Fujiishi ........................ 438/243 |
| 7,397,083 B2 | 7/2008 | Amali et al. |
| 7,449,354 B2 | 11/2008 | Marchant et al. |
| 7,504,307 B2 * | 3/2009 | Peake .......................... 438/270 |
| 7,544,568 B2 | 6/2009 | Matsuura et al. |
| 7,704,864 B2 | 4/2010 | Hshieh |
| 7,745,883 B2 * | 6/2010 | Williams et al. ............. 257/371 |
| 7,910,486 B2 | 3/2011 | Yilmaz et al. |
| 7,911,020 B2 | 3/2011 | Niimura et al. |
| 7,964,913 B2 | 6/2011 | Darwish |
| 8,076,718 B2 | 12/2011 | Takaya et al. |
| 8,247,296 B2 | 8/2012 | Grivna |
| 8,334,566 B2 | 12/2012 | Tai |
| 8,564,088 B2 | 10/2013 | Schmidt |
| 8,803,207 B2 | 8/2014 | Grebs et al. |
| 2001/0026989 A1 | 10/2001 | Thapar |
| 2001/0050394 A1 | 12/2001 | Onishi et al. |
| 2002/0016034 A1 * | 2/2002 | Gonzalez ..................... 438/218 |
| 2002/0030237 A1 | 3/2002 | Omura et al. |
| 2002/0036319 A1 | 3/2002 | Baliga |
| 2002/0123196 A1 | 9/2002 | Chang et al. |
| 2002/0130359 A1 | 9/2002 | Okumura et al. |
| 2003/0011046 A1 | 1/2003 | Qu |
| 2003/0085422 A1 | 5/2003 | Amali et al. |
| 2003/0193067 A1 | 10/2003 | Kim et al. |
| 2003/0201483 A1 | 10/2003 | Sumida |
| 2004/0021173 A1 | 2/2004 | Sapp |
| 2004/0021174 A1 | 2/2004 | Kobayashi |
| 2004/0113201 A1 * | 6/2004 | Bhalla et al. ................. 257/329 |
| 2004/0173844 A1 | 9/2004 | Williams et al. |
| 2004/0222458 A1 | 11/2004 | Hsieh et al. |
| 2004/0222461 A1 | 11/2004 | Peyre-Lavigne et al. |
| 2005/0029585 A1 | 2/2005 | He et al. |
| 2005/0062124 A1 | 3/2005 | Chiola |
| 2005/0215011 A1 | 9/2005 | Darwish et al. |
| 2005/0266642 A1 | 12/2005 | Kubo et al. |
| 2006/0014349 A1 | 1/2006 | Williams et al. |
| 2006/0113577 A1 | 6/2006 | Ohtani |
| 2006/0209887 A1 | 9/2006 | Bhalla et al. |
| 2006/0214242 A1 | 9/2006 | Carta et al. |
| 2006/0267090 A1 | 11/2006 | Sapp et al. |
| 2006/0273390 A1 | 12/2006 | Hshieh et al. |
| 2006/0285368 A1 | 12/2006 | Schlecht |
| 2007/0023828 A1 | 2/2007 | Kawamura et al. |
| 2007/0040217 A1 | 2/2007 | Saito et al. |
| 2007/0155104 A1 | 7/2007 | Marchant et al. |
| 2007/0290257 A1 | 12/2007 | Kraft et al. |
| 2008/0042172 A1 | 2/2008 | Hirler et al. |
| 2008/0090347 A1 | 4/2008 | Huang et al. |
| 2008/0164515 A1 | 7/2008 | Li |
| 2008/0197407 A1 | 8/2008 | Challa et al. |
| 2008/0211020 A1 | 9/2008 | Saito |
| 2008/0290403 A1 | 11/2008 | Ono et al. |
| 2009/0020810 A1 | 1/2009 | Marchant |
| 2009/0079002 A1 | 3/2009 | Lee et al. |
| 2009/0085099 A1 | 4/2009 | Su et al. |
| 2009/0206440 A1 | 8/2009 | Schulze et al. |
| 2009/0315104 A1 | 12/2009 | Hsieh |
| 2010/0006935 A1 | 1/2010 | Huang et al. |
| 2010/0078775 A1 | 4/2010 | Mauder et al. |
| 2010/0233667 A1 | 9/2010 | Wilson et al. |
| 2010/0289032 A1 | 11/2010 | Zhang et al. |
| 2010/0311216 A1 | 12/2010 | Marchant |
| 2011/0001189 A1 | 1/2011 | Challa et al. |
| 2011/0089486 A1 | 4/2011 | Xu et al. |
| 2011/0089488 A1 | 4/2011 | Yilmaz et al. |
| 2011/0233667 A1 | 9/2011 | Tai et al. |
| 2011/0254084 A1 | 10/2011 | Terrill et al. |
| 2013/0069145 A1 | 3/2013 | Kawano et al. |
| 2013/0140633 A1 | 6/2013 | Pattanayak |
| 2013/0187196 A1 | 7/2013 | Kadow |
| 2013/0207227 A1 | 8/2013 | Azam et al. |
| 2013/0214355 A1 | 8/2013 | Fang et al. |
| 2013/0320462 A1 | 12/2013 | Tipirneni et al. |

FOREIGN PATENT DOCUMENTS

| | | |
|---|---|---|
| DE | 112006003618 T5 | 11/2008 |
| EP | 0227894 | 7/1987 |
| EP | 0279403 A2 | 8/1988 |
| EP | 0310047 A2 | 4/1989 |
| EP | 0345380 | 12/1989 |
| EP | 0580213 | 1/1994 |
| EP | 0583023 | 2/1994 |
| EP | 0620588 | 10/1994 |
| FR | 2 647 596 | 11/1990 |
| FR | 2647596 | 11/1990 |

(56) References Cited

FOREIGN PATENT DOCUMENTS

| | | | |
|---|---|---|---|
| GB | 2033658 | 5/1980 | |
| GB | 2087648 | 5/1982 | |
| GB | 2134705 | 8/1984 | |
| GB | 2137811 | 10/1984 | |
| GB | 2166290 | 4/1986 | |
| JP | 56-58267 | 5/1981 | |
| JP | 59-84474 | 5/1984 | |
| JP | 59-141267 | 8/1984 | |
| JP | 60-249367 | 12/1985 | |
| JP | 61-80860 | 4/1986 | |
| JP | 62-176168 | 8/1987 | |
| JP | 1-42177 | 2/1989 | |
| JP | 1-198076 | 8/1989 | |
| JP | 1-310576 | 12/1989 | |
| JP | 2-91976 | 3/1990 | |
| JP | 3273180 | 4/2002 | |
| JP | 2002-540603 | 11/2002 | |
| JP | 2003-101039 | 4/2003 | |
| JP | 2003-179223 A | 6/2003 | |
| JP | 2002127830 A1 | 10/2003 | |
| JP | 2005-209983 | 8/2005 | |
| JP | 2005-286328 | 10/2005 | |
| JP | 2006-128507 | 5/2006 | |
| JP | 2006-310782 | 11/2006 | |
| JP | 2007-157799 | * 6/2007 | |
| JP | 2007157799 | 6/2007 | |
| KR | 10-2012-0027299 | 3/2012 | |
| WO | 2006027739 | * 3/2006 | ........... H01L 21/336 |
| WO | 2006027739 A2 | 3/2006 | |
| WO | 2007002857 | 1/2007 | |

OTHER PUBLICATIONS

S.C. Sun et al., "Modeling of the On-Resistance of LDMOS, VDMOS, and VMOS Power Transistors", IEEE Trans. Electron Devices, vol. ED-27, No. 2, Feb. 1980, pp. 356-367.

P. Ou-Yang, "Double Ion Implanted V-MOS Technology", IEEE Journal of Solid State Circuits, vol. SC-12, No. 1, Feb. 1977, pp. 3-10.

D. Jaume et al, "High-Voltage Planar Devices Using Field Plate and Semi-Resistive Layers", IEEE Trans. on Electron Devices, vol. 38, No. 7, Jul. 1991, pp. 1681-1684.

Baliga, "Modern Power Devices", A Wiley-Interscience Publication, John Wiley & Sons, Inc., 1987, pp. 62-131.

Barbuscia et al., "Modeling of Polysilicon Dopant Diffusion for Shallow-Junction Bipolar Technology", IEDM, 1984, pp. 757-760, No Month.

K. Shenai et al., "Optimum Low-Voltage Silicon Power Switches Fabricated Using Scaled Trench MOS Technologies", IEEE, International Electron Devices Meeting, Dec. 9, 1990, San Francisco, USA, pp. 793-797.

Antognetti, "Power Integrated Circuits: Physics, Design, and Applications," McGraw-Hill Book Co., 1986, pp. 3.14-3.27, Dec.

"SMP60N06, 60N05, SMP50N06, 50N05, N-Channel Enhancement Mode Transistors," MOSPOWER Data Book, Siliconix inc., 1988, pp. 4-423-4-426.

Chang et al., "Vertical FET Random-Access Memories With Deep Trench Isolation," IBM Technical Disclosure Bulletin, vol. 22, No. 8B, Jan. 1980, pp. 3683-3687.

Patent Application As Filed for U.S. Appl. No. 14/663,872; Inventors: Misbah Ul Azam et al.; Filed Mar. 20, 2015; "MOSFET Termination Trench,".

* cited by examiner

MOSFET ACTIVE AREA AND EDGE TERMINATION AREA CHARGE BALANCE

CROSS REFERENCE TO RELATED US APPLICATIONS

This patent application claims benefit to provisional patent application, Ser. No. 60/997,945, filed Oct. 5, 2007, entitled, MOSFET ACTIVE AREA AND EDGE TERMINATION AREA CHARGE BALANCE, and assigned to the assignee of the present invention and which is also hereby incorporated herein in its entirety by reference.

FIELD OF THE INVENTION

The present invention relates to MOSFET active area and edge termination area charge balance.

BACKGROUND

A metal-oxide semiconductor field-effect transistor (MOSFET) is a type of field-effect transistor that functions by electronically varying the width of the MOSFET channel along which charge carriers flow. The wider the MOSFET channel, the better the MOSFET can conduct. MOSFETs include gate, drain and source components. Charge carriers enter the channel via the source, and exit via the drain. The width of the MOSFET channel can be controlled by varying the voltage that is placed onto a gate electrode. In conventional MOSFETs the gate electrode is generally insulated from the channel by a thin layer of oxide.

MOSFET operational parameters affect the operation and performance of the MOSFET. MOSFET operational parameters include drain-source breakdown voltage (BVds) and drain-source on resistance (RDSon).

The MOSFET BVds is the minimum voltage that causes a portion of an insulator to become electrically conductive. Thus, generally a high BVds is desirable. Importantly, when the BVds is exceeded, current flow can occur which can prevent the MOSFET from shutting off properly. RDSon is the drain-source resistance at a specified drain current and gate-source voltage. In many applications a low RDSon is desirable and is associated with an increased MOSFET current carrying capability.

MOSFET designers often make tradeoffs between BVds and RDSon. For example, increasing the BVds by incorporating a thicker and lower doped drift region results in a higher RDSon. However, lowering RDSon by incorporating a thinner and higher doped drift region decreases BVds. Accordingly, by considering tradeoffs, designers seek to find the optimal BVds and RDSon for a MOSFET. Due to different trench widths used in the active and the trench edge termination area, it is difficult to achieve similar BVds both on the active area and on the edge termination area.

Figure 1A:
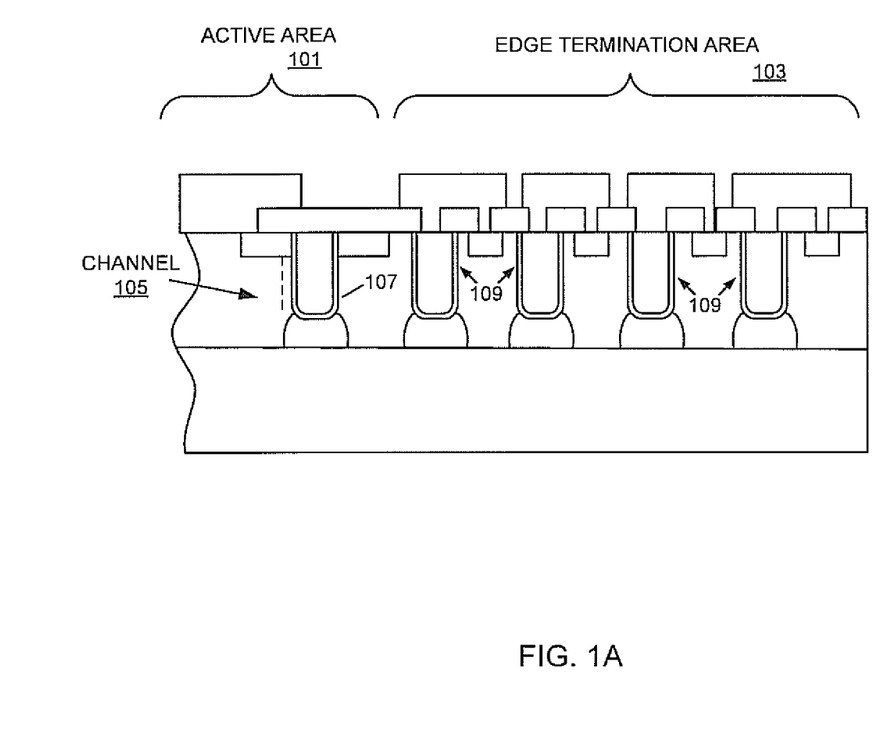
FIG. 1A shows a conventional metal oxide semiconductor field effect transistor (MOSFET) device that includes active and edge termination areas.

FIG. 1A shows a conventional MOSFET that includes active 101 and edge termination 103 areas. As is illustrated in FIG. 1A, the desired direction of current flow is vertical through the MOSFET (see dotted line representing the vertical channel 105 next to active area trench 107). However, if BVds is exceeded, then breakdown can occur in the oxide that lines the corners of device trenches, and undesirable current flow can occur in the MOSFET. This is because many conventional MOSFETs exhibit uneven electric fields where the strength of the electric field can be greatest at corners of MOSFET trenches.

Figure 1B:
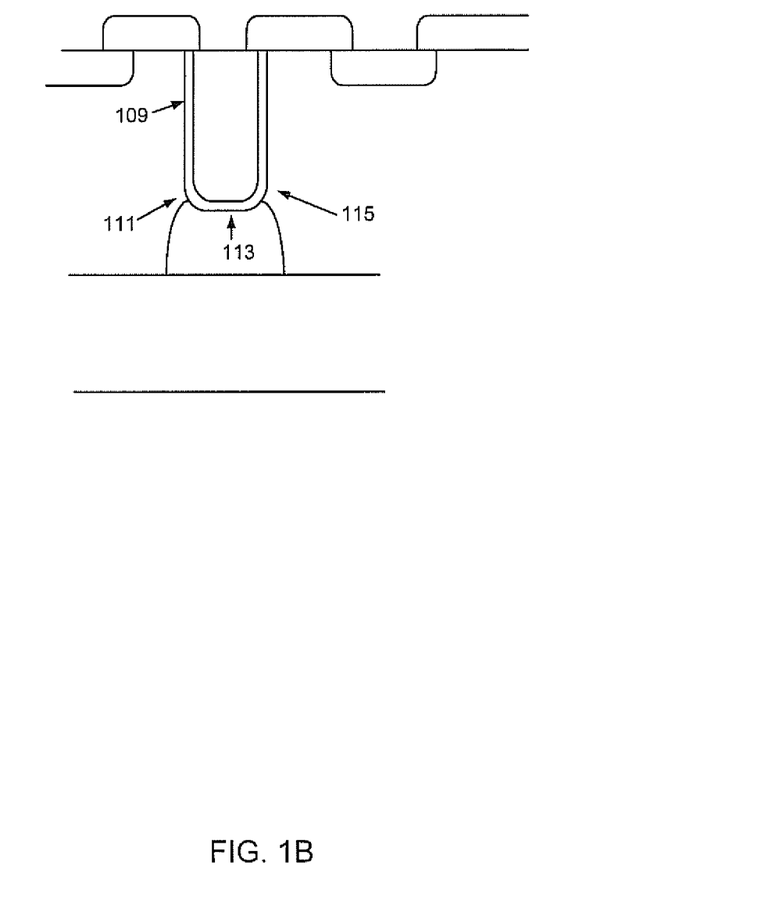
FIG. 1B shows vulnerable locations in the oxide that lines the walls of edge termination area trenches of the conventional MOSFET shown in FIG. 1B.

FIG. 1B shows trench locations 111, 113 and 115 that are vulnerable to breakdown in the oxide that lines the walls of the edge termination area trenches 109 of the conventional MOSFET shown in FIG. 1A. As discussed above, such current flow can prevent a MOSFET from shutting off properly. Importantly, many conventional MOSFETs are provided with inadequate protection against edge termination area voltage breakdown and are susceptible to such current flow.

SUMMARY OF THE INVENTION

Accordingly, a need exists for a method of providing MOSFETs with improved protection from voltage breakdown and undesirable current flow. The present invention provides a method that accomplishes this need.

Embodiments of the present invention enable the optimization of breakdown voltage (BVds) in both the active and edge termination areas of a MOSFET by making tuned implants at trench bottoms in both areas that result in a charge balanced implant region. The charge balance results in a flat electric field across the implant region that supports higher breakdown voltages (BVds). Moreover, the higher doping concentration that results from implants made in the active region advantageously lowers device on resistance (RDSon) of the MOSFET.

As a part of a disclosed method for providing charge balanced active and edge termination areas for a MOSFET, a first plurality of implants are formed at the bottom of trenches located in an active area and in an edge termination area of a MOSFET. Subsequently, a second plurality of implants is formed at the bottom of the trenches located in the active area only. The second plurality of implants formed at the bottom of the trenches located in the active area of the MOSFET causes the implants formed at the bottom of the trenches located in the active area to reach a desired concentration.

In one embodiment, a disclosed method for fabricating a MOSFET having an active area and an edge termination area includes forming first and second epitaxial layers on a substrate, forming trenches in the active area and in the edge termination area in the topmost of the epitaxial layers, and forming multiple implants at the bottom of the trenches formed in the active area and in the edge termination area. Moreover, the method includes masking the edge termination area, forming multiple implants at the bottom of the trenches formed in the active area and forming a thick oxide layer on the edge termination area. A layer of oxide formed in the trenches located in the edge termination area is thicker than a layer of oxide formed in the trenches located in the active area.

Also disclosed is a MOSFET that includes an active area and an edge termination area with both areas having similar BVds. In one embodiment, the active area includes a plurality of active area trenches, a source region adjacent one or more sidewalls of the plurality of trenches, a gate region located adjacent to and vertically underneath the source region, and a drain region located adjacent to and vertically underneath the gate region. The edge termination area includes a gate pickup trench and a plurality of termination trenches. A first plurality of implants is provided at the bottom of the trenches located in both the active area and the edge termination area. A second plurality of implants are formed at the bottom of the trenches located in the active area and causes the implants formed at the bottom of the trenches located in the active area to reach a predetermined desired concentration. The MOSFET may advantageously have optimized BVds in both the active and edge termination areas.

These and other advantages of the present invention will no doubt become obvious to those of ordinary skill in the art after having read the following detailed description of the preferred embodiments which are illustrated in the drawing figures.

BRIEF DESCRIPTION OF THE DRAWINGS

The invention, together with further advantages thereof, may best be understood by reference to the following description taken in conjunction with the accompanying drawings in which.

It should be noted that like reference numbers refer to like elements in the figures.

DETAILED DESCRIPTION OF THE INVENTION

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention.

Figure 2A:
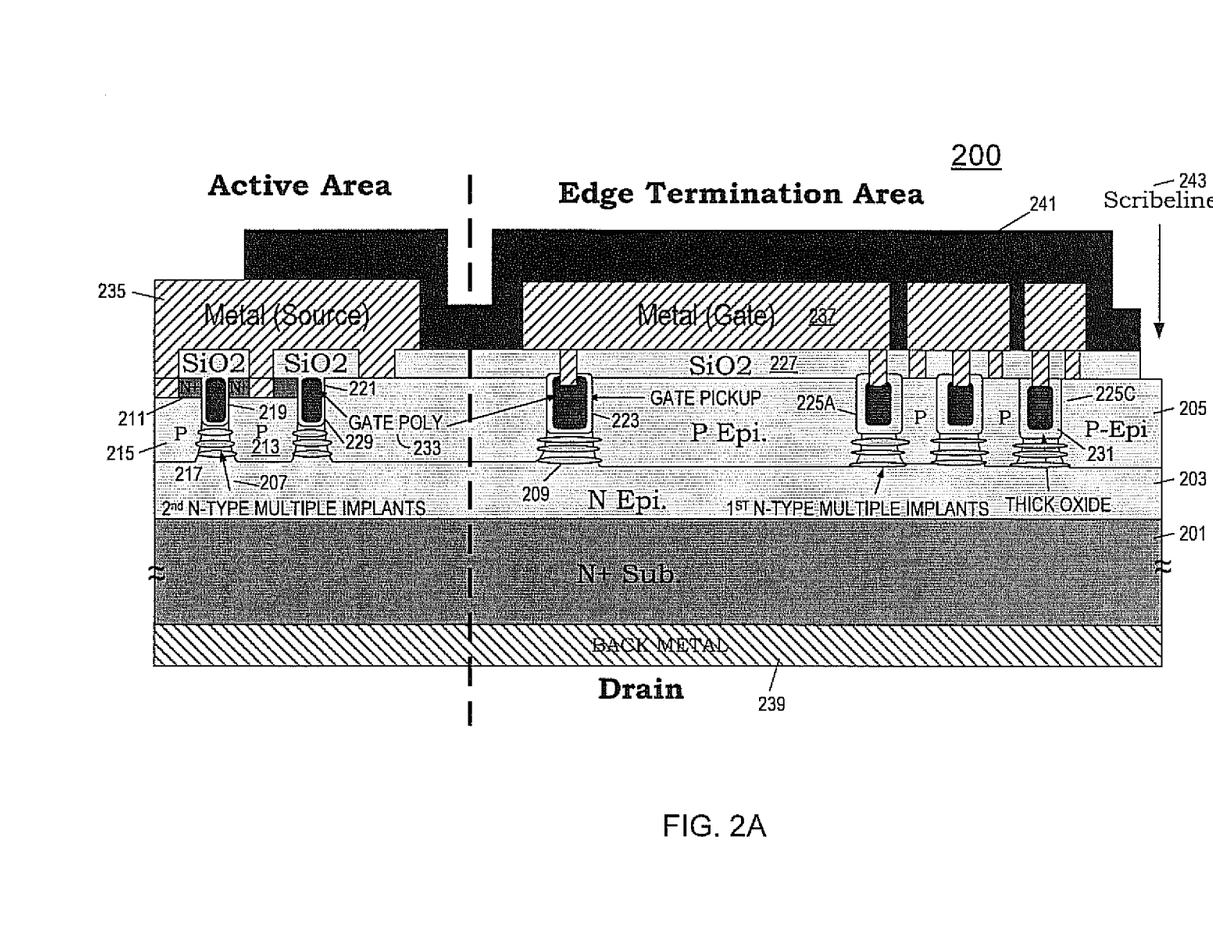
FIG. 2A shows a cross section of a MOSFET formed according to one embodiment of the invention.

MOSFET Active Area and Edge Termination Area Charge Balance According to One Embodiment of the Present Invention FIG. 2A shows a cross section of a MOSFET 200 formed according to one embodiment of the invention. In accordance with embodiments of the present invention, multiple implants are made to MOSFET 200 active area 200a and edge termination area 200b trench bottoms to achieve charge balance between these areas. In one embodiment, this charge balance provides MOSFET 200 with breakdown voltages (BVds) that are similar in each area and moreover, the BVds may be optimized in both areas. Moreover, the higher doping concentration provided by the implants results in lowered MOSFET 200 on-resistance (RDSon). Additionally, the charge balance causes the electric field across the implant region to be flat which supports an attainment of a higher BVds for MOSFET 200 as compared with MOSFETs that do not feature a charge balanced implant region.

In the FIG. 2A embodiment, MOSFET 200 includes substrate 201, epitaxial (epi) layer 203, epitaxial (epi) layer 205, multiple active area implants 207, multiple edge termination area implants 209, source implants 211, P body well 213, gate region 215, drain region 217, active area trench 219, active area trench 221, gate pickup trench 223, edge termination area trenches 225a-225c, oxide layer 227, active area trench oxide 229, edge termination area trench oxide 231, gate poly 233, source electrode 235, gate electrode 237, drain electrode 239, passivation layer 241 and scribeline 243.

Referring to FIG. 2A, multiple implants 207 and 209 are formed at the bottom of active area 200a and edge termination area 200b trenches 219, 221, 223 and 225a-225c in accordance with processes described herein (see discussion made with reference to FIGS. 3A-3H). In the FIG. 2A embodiment, the implants made at the bottom of active area trenches 219 and 221 form portions of the drain region of MOSFET 200. In one embodiment, the formation of these implants can be completed in two implantation operations. Initially, multiple implants are formed at the bottom of both active area trenches 219 and 221 and edge termination area trenches 223 and 225a-225c. Thereafter, second multiple implants are made at the bottom of active area trenches 219 and 221.

In one embodiment, the second multiple implants made at the bottom of active area trenches 219 and 221 are added to the first multiple implants that are made at the bottom of active area trenches 219 and 221 in the first implantation operation. The second multiple implants are used to advantageously "tune" or adjust the implants that are made at the bottom of active area trenches 219 and 221, in the first multiple implant operation, to a desired doping concentration. In one embodiment, the implants are tuned to achieve a charge balance between the active area 200a and the edge termination area 200b of device 200. The charge balance thus achieved between the active area 200a and the edge termination area 200b supports a higher BVds. In this manner, the BVds can be optimized in both areas 200a and 200b.

Figure 2B:
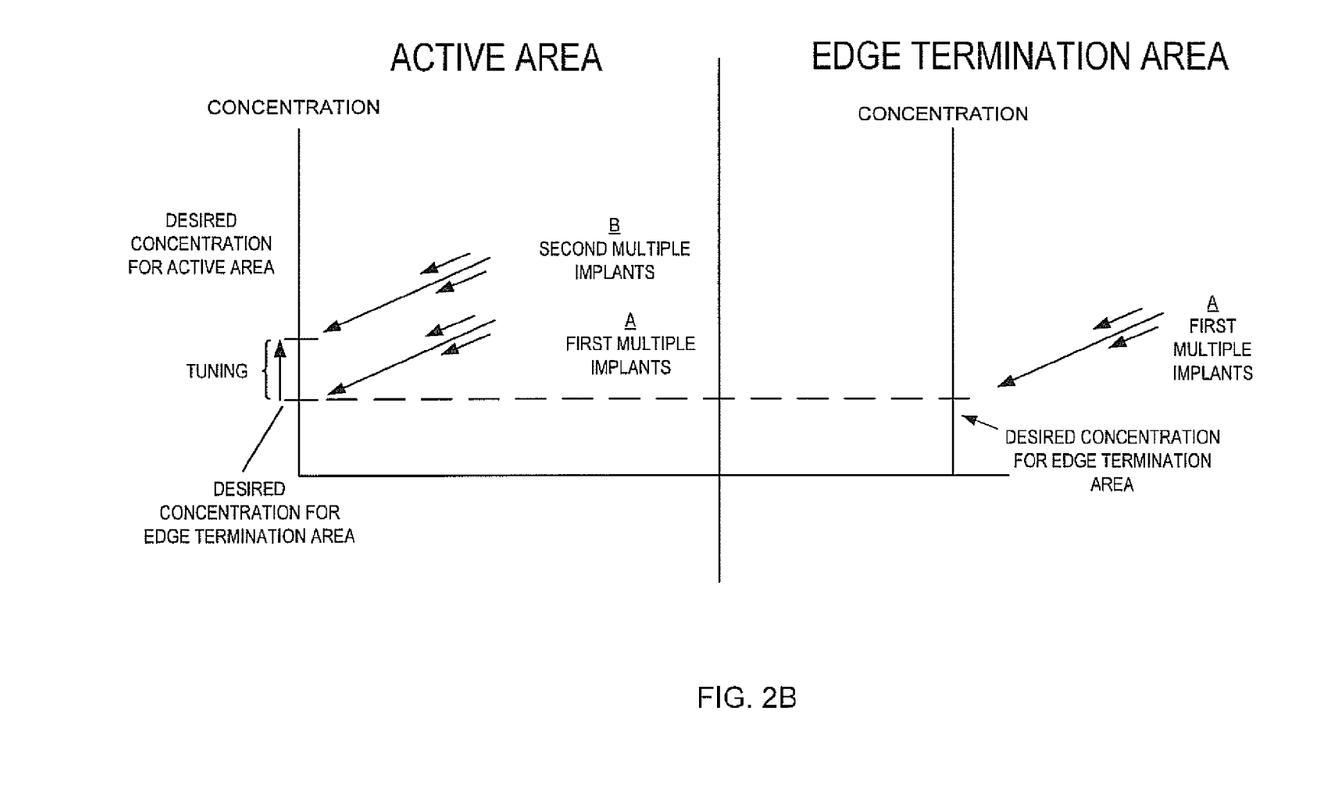
FIG. 2B illustrates tuning operations of an implantation process for achieving charge balance between active and edge termination areas according to one embodiment of the present invention.

FIG. 2B illustrates tuning operations of an implantation process for achieving the aforementioned charge balance according to one embodiment of the present invention. Referring to FIG. 2B, at A when the first plurality of implants are made at the bottom of trenches located in both the active area 200a and the edge termination area 200b, the doping concentration of implants located at the bottom of the trenches reach a level that is optimal for edge termination area trenches 223 and 225a-225c. At B when the second plurality of implants are made at the bottom of active area trenches 219 and 221, the second plurality of implants serve to "tune" the doping concentration of implants located at the bottom of active area trenches 219 and 221 to a concentration that is optimal for the active area trenches while leaving alone the trenches of the termination area.

The implantation energies used to make the implants can be selected to achieve the desired doping concentration for the implants. In one embodiment, for a hard mask thickness of 8 kilo angstroms (see discussion below) implantation energies can include but are not limited to 150, 350 and 450 ev in one example. In other embodiments, other implantation energies can be employed.

Referring again to FIG. 2A, MOSFET 200 is provided with an edge termination structure that includes edge termination trenches 225a-225c. In one embodiment, this structure is provided in order to prevent voltage breakdown or current leakage via paths created when the MOSFET 200 die is cut at scribeline 243. The plurality of trenches 225a-225c that are a part of the edge termination structure distribute or step down the source to drain voltage which lessens the risk of voltage breakdown.

In one embodiment, edge termination trench oxide 231 is formed to have a greater thickness than the thickness of active area trench oxide 229. The thickness of edge termination area trench oxide 231 enables the support of larger reverse bias voltages in the off-state than could be supported by a less thick oxide layer. In one embodiment, a 1.5 kilo angstrom thickness can be employed in forming this layer of oxide. In other embodiments, other thicknesses can be employed. This thick oxide layer, by enabling the support of larger reverse bias voltages, provides protection against voltage breakdown.

In operation, when a turn-on voltage is applied to gate electrode 237 the voltage is coupled to active area trenches 219 and 221 through gate pickup trench 223 and causes current to flow through a channel formed adjacent to active area trench 219. When a turn-off voltage is applied to gate electrode 237, high turn-off voltage differences are robustly supported by thick oxide 231 that surrounds the edge termination area trenches 225a-225c. As discussed above, this thick oxide helps to prevent breakdown where undesirable conduction such as a sudden flow of current can occur.

In one embodiment, the high doping concentration provided by multiple implants reduces electrical resistance for electron flow and thus lowers RDSon. Moreover, the charge balanced active and edge termination areas, 200a and 200b, that are provided by the multiple implants allow a full depletion of charge from the implant region in the off state, which supports high voltage conditions during off state. In contrast, during conduction state, the higher doping of the MOSFET drift region provided by multiple active area implants 207 allows easier flow of carriers thereby advantageously reducing RDSon.

The tuned implantation approach of the present invention allows the implants made to be tuned to a precise doping concentration needed for trenches of the particular widths used. It is appreciated that in this manner charge balance can be achieved despite the presence of trenches of different widths in the device. Moreover, in one embodiment, vertical current flow is maintained in active area 200a while undesirable current flow and voltage breakdown in edge termination area 200b is avoided.

In one embodiment, MOSFET 200 can be made with P epi layer/N epi layer/N+ substrate for N-channel devices and N epi layer/P epi layer/P+ substrate for P-channel devices. In order to achieve a desirable Rdson and a high BVds, MOSFET 200 multiple implants 207 and 209 are made at levels that are optimal for a desired BVds through trench bottoms to achieve charge balance over the entire implant region of the device as is discussed above. In exemplary embodiments, separate multiple implants between active area 200a trench bottom and edge termination 200b trench bottom provide optimized BVds on both areas.

Process Flow for MOSFET Active Area and Edge Termination Area Charge Balance

FIGS. 3A-3I show a series of cross sections illustrating an exemplary process for providing MOSFET active area and edge termination area charge balance using multiple implants according to one embodiment of the invention. Structures similar to those shown in FIG. 2A are similarly labeled in FIGS. 3A-3I.

Figure 3A:
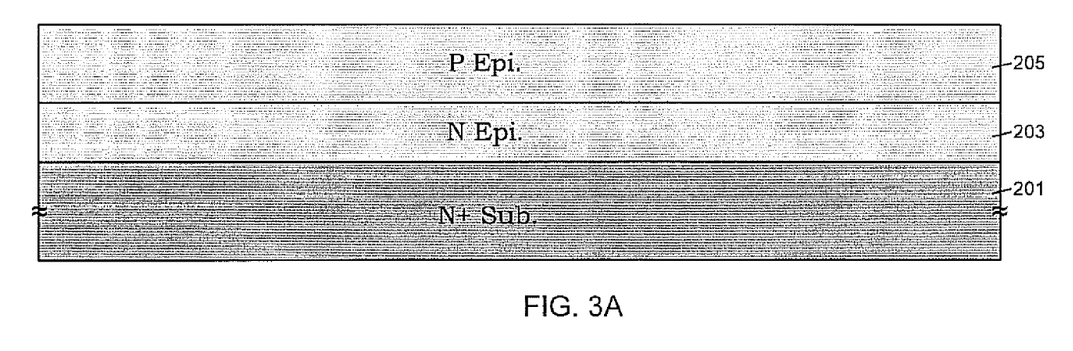
FIG. 3A shows an N epi-layer and a P epi-layer formed on an N+ substrate according to one embodiment of the present invention.
Figure 3B:
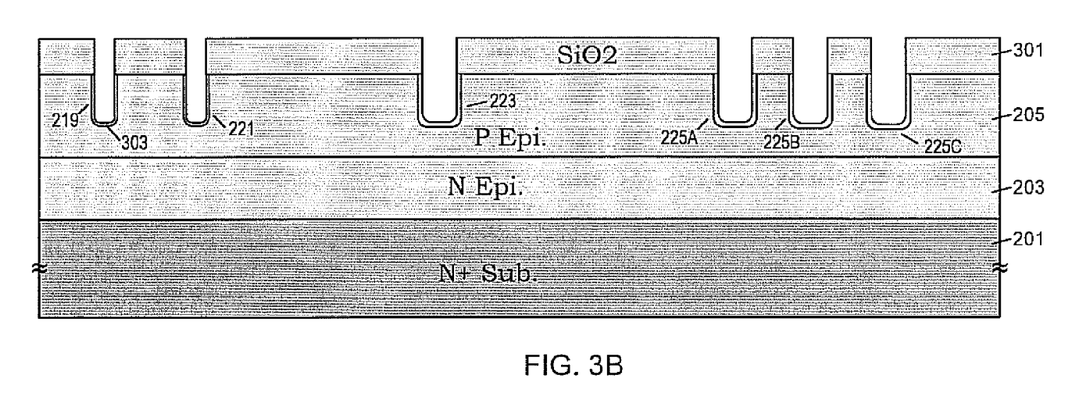
FIG. 3B shows active area and edge termination area trenches formed in a P epi-layer according to one embodiment of the present invention.

As shown in FIG. 3A, in initial operations N epi-layer 203 and P epi-layer 205 are formed on N+ substrate 201. As shown in FIG. 3B, subsequent to one or more operations that result in the cross section shown in FIG. 3A, active area and edge termination area trenches 219, 221, 223 and 225a-225c are formed in P epi-layer 205. In one embodiment, a hard mask 301 is used to define the locations of the trenches. In one embodiment, hard mask 301 can be formed from low thermal oxide, LTO, SiO2. In other embodiments, other substances can be used to form hard mask 301. In one embodiment, the locations of the openings in hard mask 301 that define the locations of active area 200a and edge termination area 200b trenches can be defined using photoresist (not shown). In one embodiment, the trenches are formed by a plasma etching process. In another embodiment, other processes can be used. The thickness of the trench can be controlled by the amount of implant energy used when plasma etching is employed.

Moreover, referring again to FIG. 3B, an oxide layer 303 is formed on the bottom and sidewalls of the trenches. In one embodiment, oxide layer 303 formed on the bottom and sidewalls of the trenches may be formed from SiO2. In one embodiment, the oxide may be formed using low thermal oxide (LTO) processes.

Figure 3C:
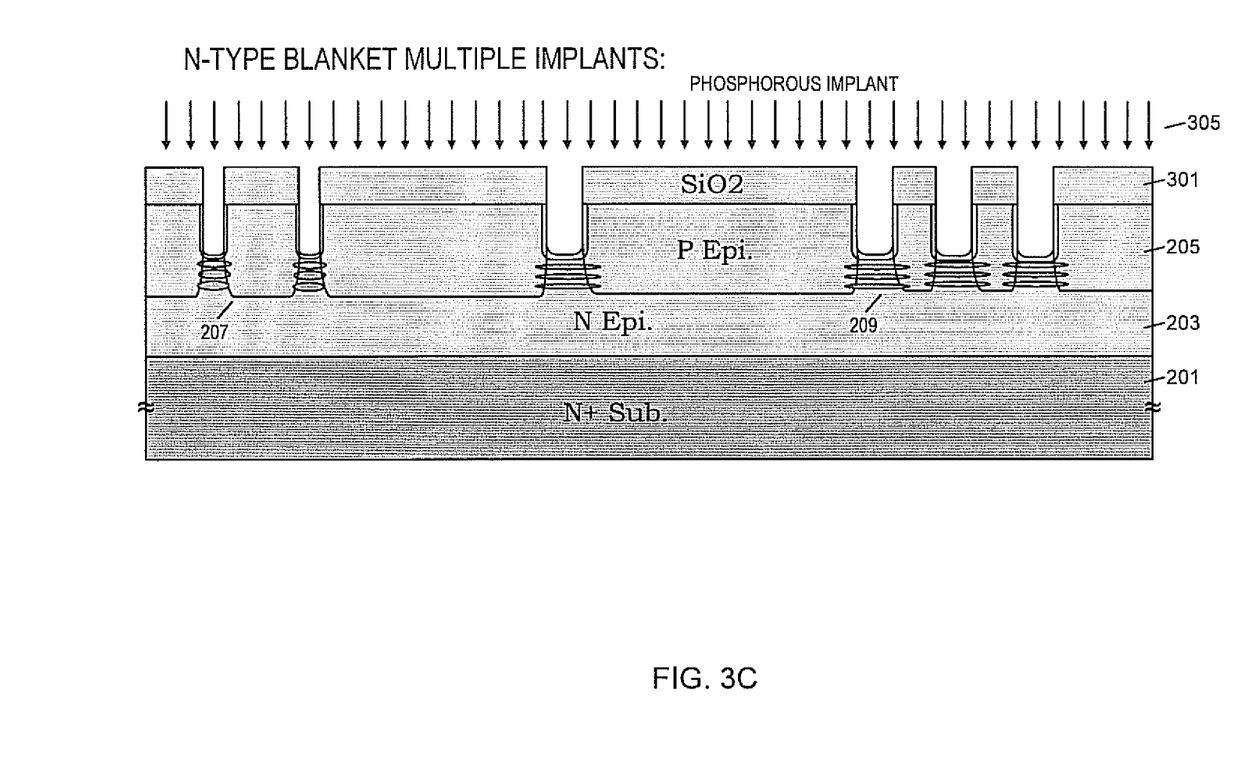
FIG. 3C shows first N-type multiple implants made at the bottom of active area and edge termination area trenches according to one embodiment of the present invention.

As shown in FIG. 3C, subsequent to one or more operations that result in the cross section shown in FIG. 3B, first N-type multiple implant operation 305 is used to make first N-type multiple implants at the bottom of active area and edge termination area trenches (e.g., 207 and 209). Referring to FIG. 3C, although the implants may be provided in a blanket manner parallel to the device surface, hard mask 301 (by selectively blocking the implants) ensures that the implants are implanted in desired locations at the bottom of the trenches (e.g., 207 and 209). In one embodiment, first N-type multiple implant operation 305 may use phosphorous implants. In other embodiments, other substances may be used.

In one embodiment, the implant energy that is used to make the implants at the bottom of the trenches depends on the desired breakdown voltage. Moreover, the dosage of the implants depends on the width of the associated trench. In one embodiment, for an 8K angstrom hard mask implant energies can include but are not limited to 150, 350 and 450 ev, for instance.

Figure 3D:
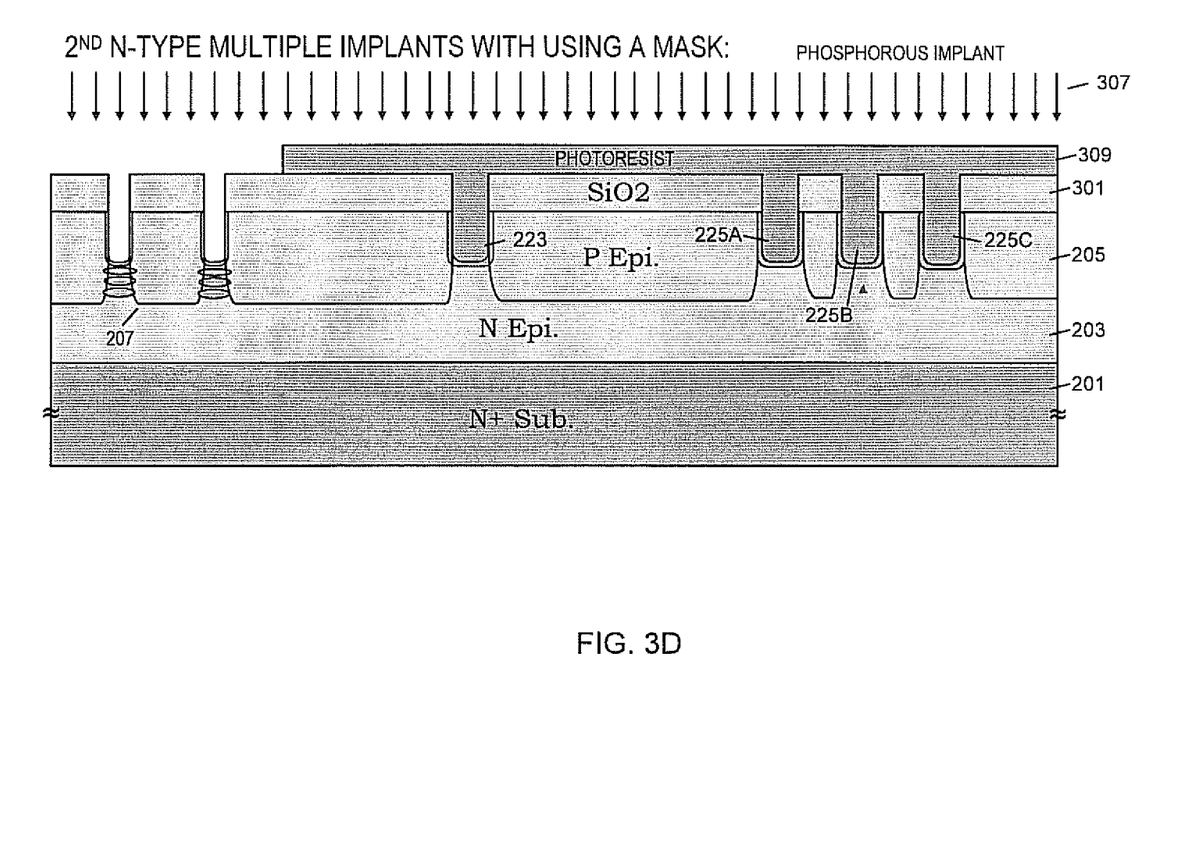
FIG. 3D shows second N-type multiple implants made at the bottom of active area trenches according to one embodiment of the present invention.

As shown in FIG. 3D, subsequent to the execution of one or more operations that result in the cross section shown in FIG. 3C, second N-type multiple implants operation 307 is used to make second N-type multiple implants at the bottom of active area trenches (e.g., 207). In one embodiment, the second N-type multiple implants are used to tune the implants already made at the bottom of active area trenches 219 and 221 to a desired concentration. In one embodiment, a photoresist mask 309 can be used to cover edge termination area 200b before the implantation of second N-type multiple implants 307, such that second N-type multiple implants 307 are prevented from implantation at the bottom of edge termination area trenches 223, 225a, 225b and 225c.

In one embodiment, second N-type multiple implant operation 307 can use phosphorous implants. In other embodiments, other substances may be used in second N-type multiple implant operation 307. In one embodiment, a photoresist mask 309 can be formed to cover each of the trenches except active area trenches 219 and 221. In one embodiment, the implant energy may depend on the desired breakdown voltage and the dosage may depend on trench width.

Figure 3E:
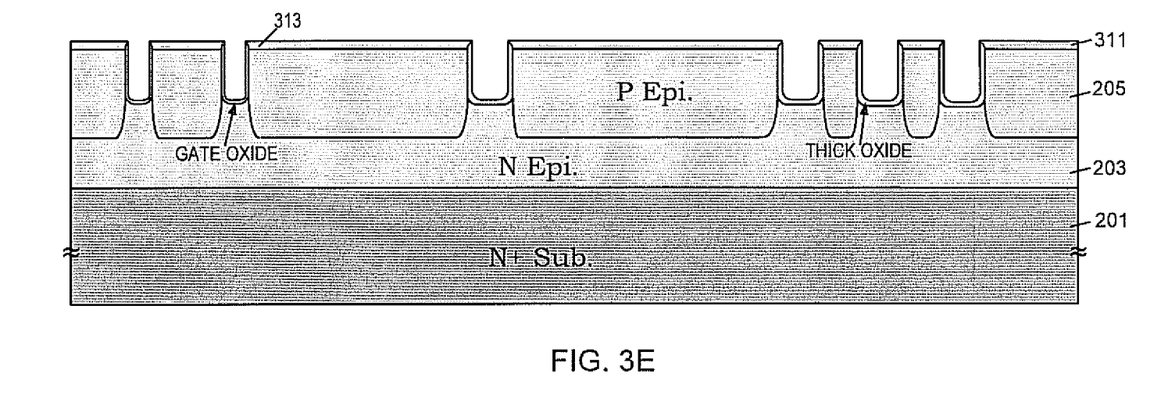
FIG. 3E shows a thick oxide layer grown on a termination trench area that is formed using a mask and a gate oxide layer grown on active area according to one embodiment of the present invention.

As shown in FIG. 3E, subsequent to the execution of one or more operations that results in the cross section shown in FIG. 3D, thick oxide 311 is grown on edge termination trench area using a mask (not shown) and a gate oxide 313 is grown on active area. In one embodiment, this may be accomplished by: (1) growing a thick oxide layer on the entire surface of the device and in trenches, (2) masking the surface of the device and trenches in the edge termination region and then removing the thick oxide layer from the remainder of the surface and trenches, and (3) thereafter reapplying a thin oxide layer on the remainder of the surface and trenches. In other embodiments, other techniques for forming thick 311 and thin oxide 313 layers can be used.

In one embodiment, thick oxide layer 311 can be grown to a 1.5 Kilo-angstrom thickness. In other embodiments, thick oxide layer 311 can be grown to other thicknesses. In one embodiment, thin oxide layer 313 can be grown to a 100 angstrom thickness. In other embodiments, thin oxide layer 313 can be grown to other thicknesses.

Figure 3F:
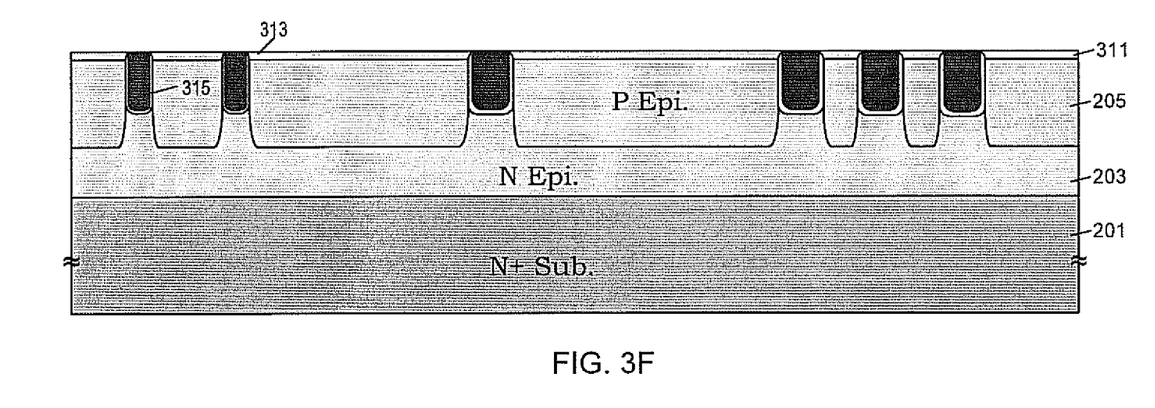
FIG. 3F shows a deposition of polysilicon formed in active area and edge termination area trenches according to one embodiment of the present invention.

As shown in FIG. 3F, subsequent to the execution of one or more operations that result in the cross section shown in FIG. 3E, a deposition of polysilicon 315 into active area 200a and edge termination area 200b trenches 219, 221, 223 and 225a-25c is performed. Thereafter, a doping of deposited polysilicon 315 is performed. Subsequently, a polysilicon etch-back or chemical mechanical polishing (CMP) of deposited polysilicon 315 is performed.

Figure 3G:
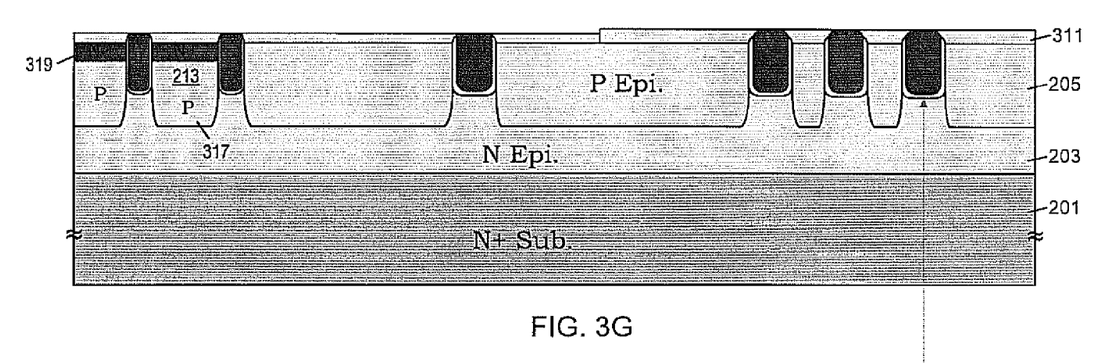
FIG. 3G shows a threshold voltage (Vt) adjustment implant and a source implant according to one embodiment of the present invention.

As shown in FIG. 3G, subsequent to the execution of one or more operations that result in the cross section shown in FIG. 3F, threshold voltage (Vt) adjustment implant 317 and source implant 211 is made. In one embodiment a source mask (not shown) can be used to make Vt adjustment implant 317 and source implant 211. In one embodiment, Vt adjustment implant 317 can include a P type implant made to the P body well 213 formed in P epi layer 205. This implant is used to tune the P type impurities located in the region to a desired level by adding to the P type impurities already present. In one embodiment, by making tuning P type implants that adjust the doping concentration in the region, the threshold voltage may be adjusted to a desired level.

Figure 3H:
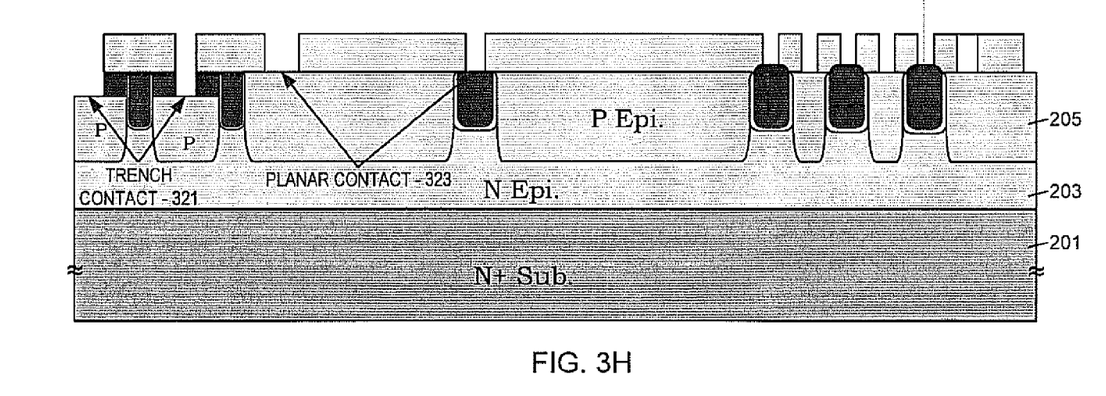
FIG. 3H shows a device cross section after low thermal oxide (LTO) and borophosphosilicate glass (BPSG) deposition according to one embodiment of the present invention.

As shown in FIG. 3H, subsequent to the execution of one or more operations that result in the cross section shown in FIG. 3G, low thermal oxide (LTO) and borophosphosilicate glass (BPSG) deposition is performed. Thereafter, planar 323 and trench contacts 321 are formed. Planar contacts 323 are contacts that allow contact at the surface of the device. Trench contacts 321 are contacts that allow contact through trenches made in the surface of the device.

Figure 3I:
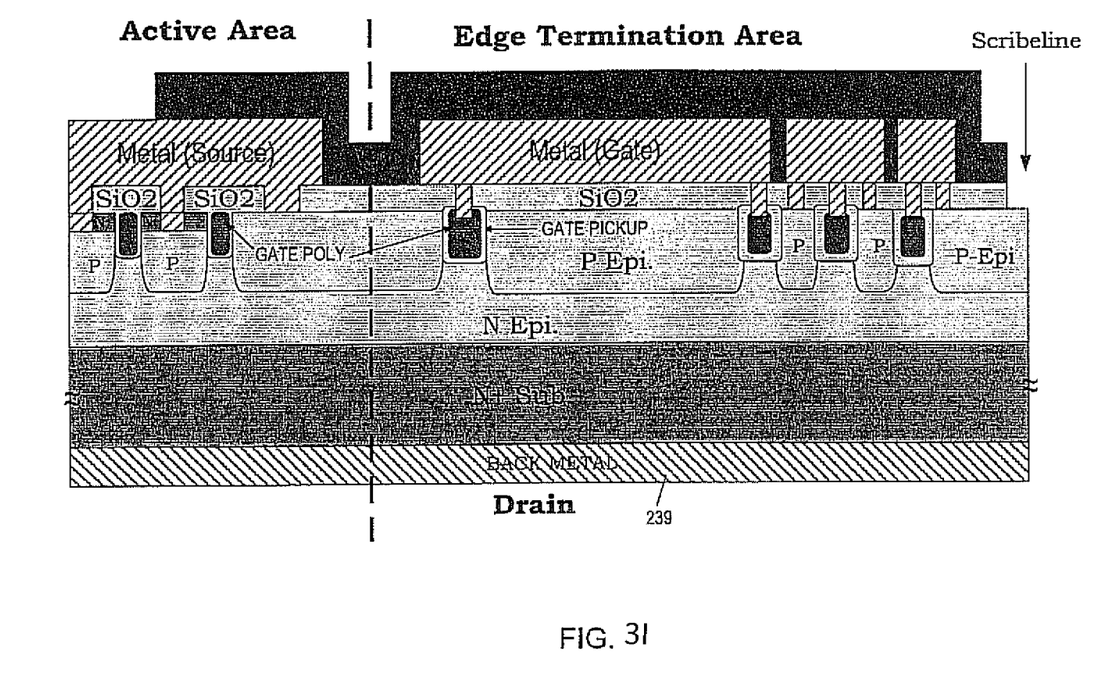
FIG. 3I shows a device cross section after contact implants and metallization and passivation layers are formed according to one embodiment of the present invention.

As shown in FIG. 3I, subsequent to the execution of one or more operations that result in the cross section shown in FIG. 3H, contact implants, metallization and passivation can be performed. These operations provide source, gate and drain electrodes that allow the application of voltages, grounding etc. And, result in the completed structure shown in FIG. 3I.

With reference to exemplary embodiments thereof, a method for fabricating a MOSFET having an active area and an edge termination area is disclosed. The method includes forming a first plurality of implants at the bottom of trenches located in the active area and in the edge termination area. A second plurality of implants is formed at the bottom of the trenches located in the active area. The second plurality of implants formed at the bottom of the trenches located in the active area causes the implants formed at the bottom of the trenches located in the active area to reach a predetermined concentration.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

We claim:

1. A method for fabricating a semiconductor device having an active area and an edge termination area, said method comprising:
   forming a first plurality of localized implants in a first operation at the bottom of trenches located in said active area and at the bottom of trenches located in said edge termination area; and
   forming a second plurality of localized implants in a second operation at the bottom of said trenches located in said active area while leaving alone said first plurality of implants located in said edge termination area, wherein said second plurality of implants formed at said bottom of said trenches located in said active area causes said implants formed at the bottom of said trenches located in said active area to reach a predetermined concentration,
   wherein said first plurality of localized implants are formed before a masking of said edge termination area and said second plurality of implants are formed after a masking of said edge termination area.

2. The method of claim 1 further comprising:
   masking said edge termination area before said forming said second plurality of implants at said bottom of said trenches located in said active area.

3. The method of claim 1 further comprising:
   forming a layer of oxide on the walls of said trenches located in said active area; and
   forming a layer of oxide on the walls of said trenches located in said edge termination area, wherein said layer of oxide on the walls of said trenches located in said edge termination area is thicker than the layer of oxide formed on the walls of said trenches located in said active area.

4. The method of claim 1 further comprising:
forming a plurality of edge termination contacts in said edge termination area.

5. The method of claim 3 wherein said forming a layer of oxide on the walls of said trenches located in said active area is performed after said forming a layer of oxide on the walls of said trenches located in said edge termination area.

6. The method of claim 1 wherein said first and said second plurality of implants result in a simultaneous charge balance within said active area and within said edge termination area.

7. The method of claim 1 wherein said first and said second plurality of implants are phosphorous implants for N-channel devices and boron implants for P-channel devices.

8. The method of claim 1 wherein said forming oxide on said walls of said trenches located in said active area and said trenches located in said edge termination area is implemented using a low thermal oxide (LTO) process.

9. A method for fabricating a MOSFET having an active area and an edge termination area, said method comprising:
forming first and second semiconductor layers on a substrate;
forming trenches in said active area and in said edge termination area in the topmost of said semiconductor layers;
forming first multiple localized implants at the bottom of said trenches formed in said active area and in said edge termination area;
masking said edge termination area;
forming second multiple localized implants at the bottom of said trenches formed in said active area; and
forming an oxide layer in said trenches formed in said edge termination area and forming an oxide layer in said trenches formed in said active area, wherein said oxide layer formed in said trenches in said edge termination area is thicker than said oxide layer formed in said trenches in said active area,
wherein said first plurality of localized implants are formed before a masking of said edge termination area and said second plurality of implants are formed after a masking of said edge termination area.

10. The method of claim 9 further comprising:
forming a polysilicon layer that fills said trenches and performing polysilicon doping and a polysilicon etch back of said polysilicon layer;
forming source implants and a threshold voltage adjustment implant;
forming planar and trench contacts; and
forming contact implants and a metallization layer in said contacts and a passivation layer on said metallization layer.

11. The method of claim 9 further comprising:
forming a plurality of edge termination contacts in said edge termination area.

12. The method of claim 9 wherein said forming said oxide layer in said trenches formed in said active area is performed after said forming said oxide layer in said trenches formed in said edge termination area.

13. The method of claim 9 wherein said first and said second plurality of implants results in a simultaneous charge balance within said active area and within said edge termination area.

14. The method of claim 9 wherein said first and said second plurality of implants are phosphorous implants for N-channel devices and boron implants for P-channel devices.

15. The method of claim 9 wherein said oxide layer formed in said trenches formed in said active area and formed in said trenches formed in said edge termination area is formed using a low thermal oxide (LTO) process.

* * * * *